(12) United States Patent
Wang et al.

(10) Patent No.: US 11,238,928 B2
(45) Date of Patent: Feb. 1, 2022

(54) READ-WRITE CIRCUIT AND READ-WRITE METHOD OF MEMRISTOR

(71) Applicant: Huazhong University of Science and Technology, Hubei (CN)

(72) Inventors: Xingsheng Wang, Hubei (CN); Enming Huang, Hubei (CN); Xiangshui Miao, Hubei (CN)

(73) Assignee: Huazhong University of Science and Technology, Hubei (CN)

( * ) Notice: Subject to any disclaimer, the term of this patent is extended or adjusted under 35 U.S.C. 154(b) by 0 days.

(21) Appl. No.: 17/049,024

(22) PCT Filed: Nov. 12, 2019

(86) PCT No.: PCT/CN2019/117419
§ 371 (c)(1),
(2) Date: Oct. 19, 2020

(87) PCT Pub. No.: WO2021/051548
PCT Pub. Date: Mar. 25, 2021

(65) Prior Publication Data
US 2021/0407589 A1 Dec. 30, 2021

(30) Foreign Application Priority Data
Sep. 17, 2019 (CN) .......................... 201910877351.3

(51) Int. Cl.
*G11C 11/00* (2006.01)
*G11C 13/00* (2006.01)
*G11C 7/06* (2006.01)

(52) U.S. Cl.
CPC .............. *G11C 13/004* (2013.01); *G11C 7/06* (2013.01); *G11C 13/0038* (2013.01); *G11C 13/0069* (2013.01)

(58) Field of Classification Search
CPC .... G11C 7/06; G11C 13/0038; G11C 13/0069
(Continued)

(56) References Cited

U.S. PATENT DOCUMENTS

2010/0315858 A1* 12/2010 Lynch ................. G11C 11/4099
365/149
2016/0372168 A1* 12/2016 Lynch ...................... G11C 7/14
2019/0013060 A1* 1/2019 Jeong ................ H03F 3/45264

FOREIGN PATENT DOCUMENTS

CN 103268772 A 8/2013
CN 105825885 A 8/2016
(Continued)

*Primary Examiner* — Vu A Le
(74) *Attorney, Agent, or Firm* — Hamre, Schumann, Mueller & Larson, P.C.

(57) ABSTRACT

A read-write circuit mainly includes a read circuit and a write circuit. The write circuit comprises: a first voltage selector and a first voltage follower circuit that is electrically connected to the memristor storage array. The read-write circuit further includes a second voltage selector and a second voltage follower circuit that is electrically connected to the memristor storage array. Voltage stable following during bipolar writing is selected through the foregoing selector. Meanwhile, the reading circuit is provided with a variable resistor to select an access mode. The actual read-out voltage and the output voltage passing through the reference resistor under the same read voltage are input into a differential amplifier to obtain read-out data.

10 Claims, 5 Drawing Sheets

(58) Field of Classification Search
USPC .......................................................... 365/148
See application file for complete search history.

(56) References Cited

FOREIGN PATENT DOCUMENTS

| | | |
|---|---|---|
| CN | 106920568 A | 7/2017 |
| WO | 2015005920 A1 | 1/2015 |

* cited by examiner

READ-WRITE CIRCUIT AND READ-WRITE METHOD OF MEMRISTOR

TECHNICAL FIELD

The present invention pertains to the field of memristor read-write circuits and more specifically, relates to a read-write circuit and a read-write method of a memristor.

BACKGROUND ART

For a memory material using a memristive material as a substrate, such as a material using HfOx as a substrate or a similar material, an appropriate voltage can be applied to switch the memristive material between high resistance and low resistance settings. Generally speaking, low resistance state is a state formed by a conductive path and has a low resistance value and high resistance state is a state when the conductive path is disconnected and has a high resistance value. Through response of a memristive material to different excitations, a plurality of resistance states are formed to store or read data.

The storage and read operations of a memristor include a plurality of voltages with different amplitudes. For example, the most basic operations among memristor read and write operations are set (write 1) and reset (write 0) operations, while for the operations of a memristor with multiple resistance states, multiple corresponding set or reset pulse widths are added to achieve the corresponding resistance states. For the above operations, it is necessary to quickly and accurately apply voltages to the electrode terminals of the memristor. Meanwhile, the resistance state of the memristor changes rapidly with the application of various operating voltages. Therefore, the applied write voltage must have good stability and not drift and change with the change of the resistance value of the memristor, otherwise it will easily lead to a write failure or over-operation, causing greater random fluctuations of resistance distribution and resulting in read-out data errors.

SUMMARY OF THE INVENTION

To address the above defects or improvement demands of the prior art, a fast and stable memristor read-write circuit is provided, which can provide a high-speed stable read-write voltage, random fluctuations of the memristor are considered in the design of the read-out circuit and the stability of the memristor circuit is improved.

In order to achieve the above object, the present invention provides a memristor read-write circuit, wherein the read-write circuit comprises a voltage follower circuit arranged for a read-write circuit voltage applied to a memristor storage unit, and the voltage follower circuit is connected to a selective voltage according to a control signal, or to a break-over voltage corresponding to the selective voltage and forming a read-write operating circuit with the memristor storage unit to achieve a switching effect on the read-write circuit.

Further, the voltage follower circuit comprises a voltage selector, an input terminal of the voltage selector accesses a shutdown voltage of a turn-on circuit, another input terminal of the voltage selector is connected to an amplifier, another input terminal of the amplifier accesses a break-over voltage of the operating circuit, an output terminal of the amplifier is connected to a feedback tube and the voltage selector also accesses the feedback tube to form a voltage follower circuit.

Further, the read-write circuit is applied between a bipolar memristor and a first voltage selector electrically connected to a pole of the memristor storage unit, and between the bipolar memristor and a second voltage selector electrically connected to the other pole of the memristor storage unit; the foregoing two electrical connections or one of the electrical connections is provided with the voltage follower circuit; and the first voltage selector and the second voltage selector are used to select the selective voltage, which is input to the voltage follower circuit.

Further, the read circuit comprises a differential amplifier, which outputs read-out data and a first branch of the differential amplifier is from a read-out signal of the memristor storage unit;

The read circuit further comprises a variable resistor selector. According to a control signal, the variable resistor selector selects a corresponding reference resistor, which accesses a reference voltage circuit to form a second branch read-out signal and input the second branch read-out signal to the differential amplifier.

Further, the reference voltage circuit comprises a third voltage follower circuit, the third voltage follower circuit comprises a third amplifier and a third feedback tube, an input terminal of the third amplifier accesses an output of the variable resistor selector and meanwhile forms a voltage follower circuit with the third feedback tube and the third amplifier, and another input terminal of the third amplifier is connected to a read voltage signal.

The present invention further discloses a write method of a memristor read-write circuit, wherein the foregoing method comprises the following steps:

determining the selective voltage as a write voltage through a first control signal; and connecting a write voltage circuit through a second control signal and maintaining a stable voltage input of a voltage follower circuit at a write-in terminal.

The present invention further discloses a read method of a memristor read-write circuit, wherein the foregoing method comprises the following steps:

determining the selective voltage as a read voltage through a first control signal; and;

connecting a read voltage circuit through a second control signal, maintaining a stable voltage input of a voltage follower circuit at a read-in terminal and reading a signal.

Further, the read method further comprises the following steps:

collecting a first-channel read-out signal of the memristor storage unit and inputting it to a differential amplifier;

generating a fourth control signal to control the variable selective resistor to access a reference read voltage circuit;

inputting a read-out voltage of the reference read voltage circuit as a first-channel reference signal into the differential amplifier (47); and outputting read-out data by the differential amplifier based on the first-channel read-out signal and the first-channel reference signal.

Further, the fourth control signal is a control signal generated from comparison between the first-channel read-out signal and the reference signal, or a control signal selector randomly selects and accesses a variable resistor and is adjusted after a read-out failure to select other resistors to continue the read operation until read-out is completed and if a preset number of read-out failures is reached, failure of the current memristor storage unit will be determined.

Further, the second control signal connects a write voltage circuit through the following steps:

controlling the voltage follower circuit at a first terminal of the memristor storage unit to connect a selective voltage; and controlling the voltage follower circuit at a second terminal of the memristor storage unit to connect a break-over voltage corresponding to the selective voltage and forming an operating circuit with the memristor storage unit.

On the whole, compared with the prior art, the above technical solutions conceived by the present invention have the following beneficial effects:

(1) By setting a selector in a voltage follower circuit and using a circuit connection signal as a reception input of the selector, the read-write circuit realized according to the present invention can realize connection of the read-write circuit under the action of a control signal and achieve a technical effect of simplifying the circuits while providing a stable read-write voltage;

(2) After voltages are selected through the selector, amplifier voltage follower circuits are set for selected read-write voltages to achieve a technical effect of rapidly and stably providing voltages and the amplifier voltage follower circuits are set at all application terminals of the read-write circuit that need stable voltages;

(3) A differential output design is adopted for the read-out circuit and a read-out method of variable reference resistor is proposed for reference voltage to solve the problem of read-out circuit drift caused by resistance diversity of the memristor.

Figure 1:
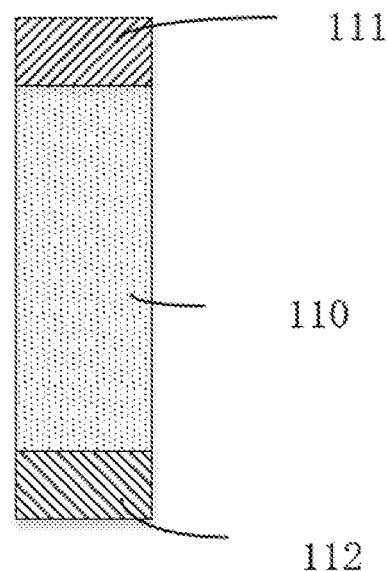
FIG. 1 is a schematic view of a storage unit applied by a memristor read-write circuit realized according to the present invention.

In all figures, the same reference sign indicates the same structure. To be specific:

A voltage group of forward input: Vforming means a forward voltage of a forming operation; Vset means a forward voltage that needs to be applied in a Set operation; Vread means a forward voltage that needs to be applied in a read operation; Vtest means a test voltage applied in a forward direction; a voltage group of reverse input: Vreset is a reverse voltage of a reset operation; Vtest is a test voltage of reverse input.

11: memristor unit in 1T1R structure; 12: bit line selection transistor in a storage array; 13: word line transistor in 1T1R structure 111: memristor top electrode; 110: memristor function layer; 112: memristor bottom electrode; 132: transistor source electrode in 1T1R structure; 121: bit line transistor switching signal; 131: word line transistor switching signal 21: first voltage follower circuit; 22: second voltage follower circuit; 31: first voltage selector (forward voltage 1-of-4 selector, control signal of forward input voltage 1-of-4 selector 21); 32: second voltage selector (reverse voltage 1-of-2 selector, control signal of reverse input voltage selector)

211: first amplifier; 212: first feedback tube; 213: third voltage selector (forward voltage 1-of-2 selector)

221: second amplifier (high-gain amplifier); 222: second feedback tube; 223: fourth voltage selector 41: first current-voltage conversion circuit (a diode is connected to a PMOS tube 212 for converting current into voltage); 42: current feedback circuit; 43: second current-voltage conversion circuit; 44: third voltage follower circuit; 45: variable resistor selector (1-of-4 selector for reference resistor); 46: variable resistor; 47: sensitive differential amplifier 441: third amplifier; 442: third feedback tube

DETAILED DESCRIPTION

FIG. 1 shows an embodiment of a storage unit applied by a memristor read-write circuit realized according to the present invention. The structure of the storage unit includes three parts: a top electrode 111, a function layer 110 and a bottom electrode 112, which is a typical sandwich structure, the electrode material of the top electrode and the bottom electrode can be Ti, Ta, TiN or TaN and the material of the function layer is HfOx.

In a specific implementation manner involved by the present invention, the top electrode of the memristor storage unit is made of TiN, the function layer is made of HfOx and the bottom electrode is made of Ti. Under such setting of materials, when a certain forward voltage is applied to the top electrode of the foregoing memristor storage unit and the bottom electrode is connected to 0 voltage, a Set operation will be implemented to set the memristor storage unit in a low resistance state (called applying a forward voltage); and when a certain forward voltage is applied to the bottom electrode and the top electrode is connected to 0 voltage, a Reset operation will be implemented to set the memristor in a high resistance state (called applying a reverse voltage).

Of course, the scope of application of the read-write circuit according to the present invention is not limited to the foregoing embodiment of a bipolar storage structure and the materials of the electrodes and the function layer are not strictly limited, either. The design of the read-write circuit and the read-write method according to the present invention mainly targets a read-write circuit and a read-write method of a memristor, which applies read-write voltages.

Figure 2:
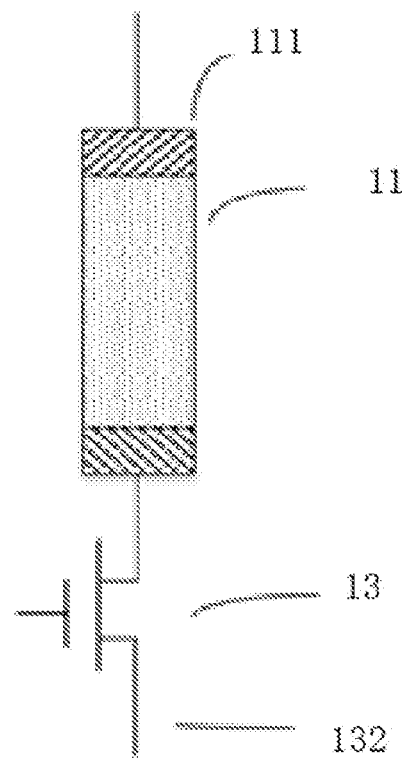
FIG. 2 is a schematic view of basic storage architecture of a storage unit applied by a memristor read-write circuit realized according to the present invention.

FIG. 2 is a schematic view of basic storage architecture of a storage unit applied by a bipolar memristor read-write circuit realized according to an embodiment of the present invention, which is conventional 1T1R architecture, i.e., a memristor unit per transistor. The grid electrode of a word line transistor 13 is connected to a word line control signal, the drain electrode is connected to the bottom electrode 112 of the memristor and the top electrode 111 is connected to the source electrode of a bit selection transistor 12.

Figure 3:
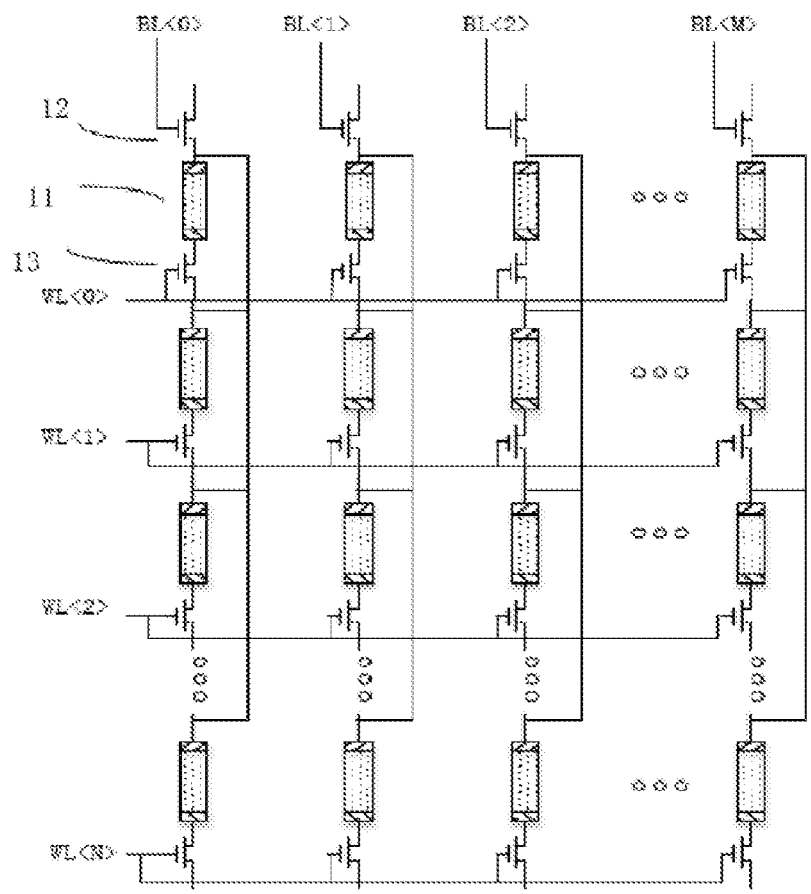
FIG. 3 is a schematic view of storage array architecture corresponding to a storage unit applied by a memristor read-write circuit realized according to the present invention.

FIG. 3 is a schematic view of storage array architecture corresponding to a storage unit applied by a memristor read-write circuit realized according to the present invention. The drain electrode of the bit selection transistor 12 is connected to a top electrode of a column of storage units, and word selection transistors 13 on the same row share a grid electrode, thereby constituting an N×M storage array. When the $X^{th}$ word selection transistor is selected and the $Y^{th}$ bit transistor is selected, only the memristor storage unit on row X and column Y will be selected.

Figure 4:
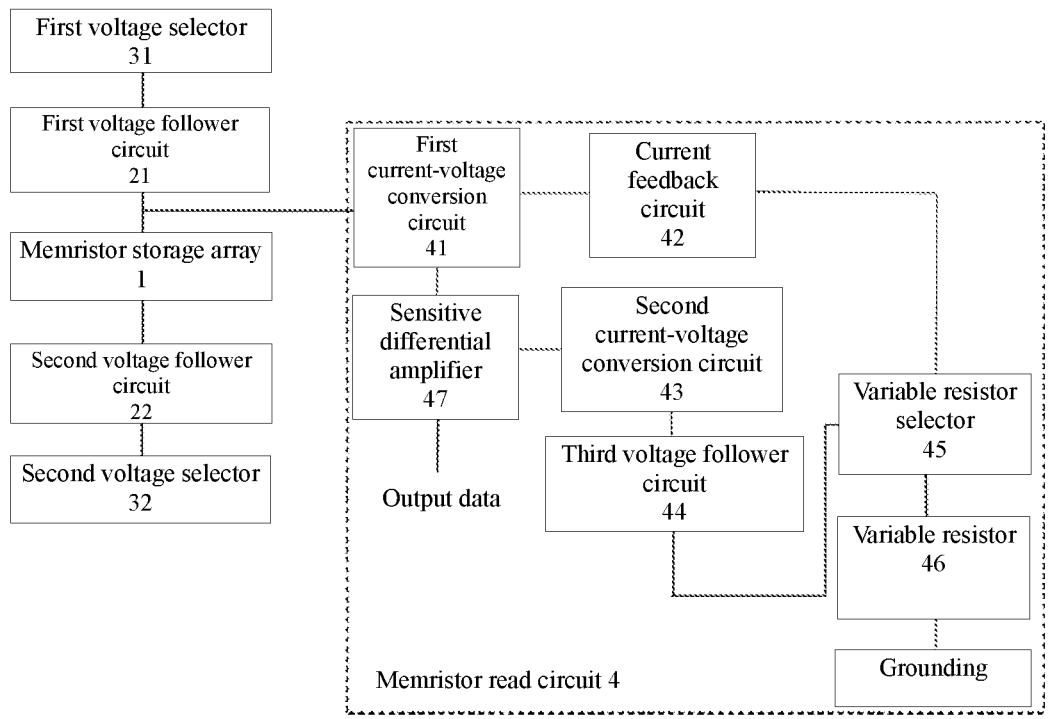
FIG. 4 is a schematic view of a structural framework of an implementation manner of a high-speed read-write circuit realized according to the present invention and specific to a memristor storage unit.

FIG. 4 is a schematic view of a structural framework of an implementation manner of a high-speed read-write circuit realized according to the present invention and specific to a memristor storage unit. The memristor read-write circuit realized according to the present invention mainly comprises two parts: a read circuit module and a write circuit module.

The read circuit module comprises a first voltage follower circuit 21 electrically connected to a first electrode of a memristor storage array 1 and a first voltage selector 31 electrically connected to the first voltage follower circuit 21. The read-write circuit module further comprises a second voltage follower circuit 22 electrically connected to a second electrode of the memristor storage array 1 and a second voltage selector 32 electrically connected to the second voltage follower circuit 22;

The first voltage selector 31 is used to select corresponding voltages specific to Forming, Set, Read and Test operations and accepts external control signals to select corresponding voltages and apply the voltages to the first voltage follower circuit 21. The output of the first voltage follower circuit 21 is connected to the source electrode of a bit selection transistor 12 connected to the top electrode 111 of the storage unit;

The second voltage selector 32 is used to select corresponding voltages specific to Reset and Test operations of the second electrode and accepts external control signals to select corresponding voltages and apply the voltages to the second voltage follower circuit 22. The output of the second voltage follower circuit 22 is connected to the source electrode of a word selection transistor 13 connected to the bottom electrode 112 of the storage unit;

The present invention is able to solve the problem of maintaining stability of input voltage, which does not drift with the fast changes of the resistance value of the memristor storage unit in the read-write process. The improvement measure mainly rests with the setting of the first voltage follower circuit 21 and the second voltage follower circuit 22. The setting of the foregoing two circuits allows the output voltage of the first voltage follower circuit 21 to stably output a voltage selected by the selector and apply the voltage to the selected memristor storage unit;

The first voltage follower circuit 21 comprises a first amplifier 211, a first MOS feedback tube 212 and a third voltage selector 213. An input terminal of the first amplifier 211 is connected to an output of the first voltage selector 31, an output of the first amplifier is connected to the grid electrode of the first MOS feedback tube 212, another input terminal of the first amplifier 211 and a grounding signal are used as voltage selection terminals of a third voltage selector 213, an output terminal of the third voltage selector 213 is connected to the source electrode of a bit selection transistor 12 and is also connected to the drain electrode of the first MOS feedback tube 212, and the drain electrode of the first MOS feedback tube 212 is connected to the source electrode of the bit selection transistor 12;

The second voltage follower circuit 22 comprises a second amplifier 221, a second MOS feedback tube 222 and a fourth voltage selector 223. An input terminal of the second amplifier 221 is connected to an output of the second voltage selector 32, an output of the second amplifier 221 is connected to the grid electrode of the second MOS feedback tube 222, another input terminal of the second amplifier 221 and a grounding signal are used as voltage selection terminals of a fourth voltage selector 223, an output terminal of the fourth voltage selector 223 is connected to the source electrode of a word selection transistor 13 and is also connected to the source electrode of the second MOS feedback tube 222, the source electrode of the second MOS feedback tube 222 is connected to the source electrode of the word selection transistor 13, and the drain electrode of the second MOS feedback tube 222 is connected to a reference voltage;

The read circuit 4 mainly comprises a first current-voltage conversion circuit 41. An input terminal of the first current-voltage conversion circuit is connected to the source electrode of a first MOS feedback tube 212, an output terminal is connected to both a lower-level current feedback circuit 42 and a sensitive differential amplifier 47, the first current feedback circuit 42 as a channel of control signal is input to a control terminal of a variable resistor selector 45, an input terminal of the variable resistor selector 45 is connected to a plurality of optional resistance values, an output terminal of the variable resistor selector 45 is connected to a third voltage follower circuit 44, the third voltage follower circuit 44 is connected to a second current-voltage conversion circuit 43, an output terminal of the second current-voltage conversion circuit 43 is connected to the sensitive differential amplifier 47 and lastly, read-out data are output through the sensitive differential amplifier 47;

Further, the structural form of the third voltage follower circuit 44 comprises a third amplifier 441 and a third MOS feedback tube 442. An input terminal of the third amplifier 441 is connected to an output of a variable resistor selector 45 and another input terminal is connected to a Vread signal, an output terminal of the third amplifier 441 is connected to the grid electrode of the third MOS feedback tube 442 and is also connected to the source electrode of the third MOS feedback tube 442, and the drain electrode of the third MOS feedback tube 442 is connected to a second current-voltage conversion circuit 43.

Further, a current feedback module 42 comprises a plurality of comparators. Through comparison of read-out voltages, a control signal can be generated to a variable resistor selector 45 and based on the control signal, the resistance value of the corresponding variable resistor is selected, thereby accurately reading out the resistance value of the memristor.

Working principle of the current feedback module 42: A control signal is generated based on a read voltage signal collected by the read circuit. This control signal can select access of resistance value of the variable resistor and realize an output of the reference terminal of the read voltage. In an implementation manner, the foregoing current feedback module 42 comprises a plurality of comparators. For example, a collected read voltage signal is input into three comparators and another input of the three comparators is three reference voltage signals (e.g., corresponding to high resistance state, low resistance state, medium resistance state, etc.), thereby generating 3-digit logical digital control signals through comparison and realizing selective control of the variable resistor selector 45. Of course, a plurality of comparators can be set, which are compared with a plurality of reference voltage signals and realize more accurate voltage regulation and control, thereby improving the read-out accuracy of voltage drift.

Further, with regard to the design of a technical solution in which a control signal is generated based on a read voltage signal, the foregoing setting method is a digital feedback setting method. In other implementation manners, the setting method of analog circuit can be used to realize the connection mode in which different currents and voltages correspond to different resistor access circuits so as to achieve selection of variable resistors. In a realization method of analog signal feedback control, the first current-voltage conversion circuit 41 and the current feedback module 42 generally use the control mode of logical output in a digital realization method, but in the method of analog signal, the size of voltage and current signals is mainly used to connect resistance circuits of corresponding variable resistors so that the signal at the reference voltage terminal can read out reference signals along with the resistance drift of the memristor circuit and make adjustments accordingly.

Figure 6:
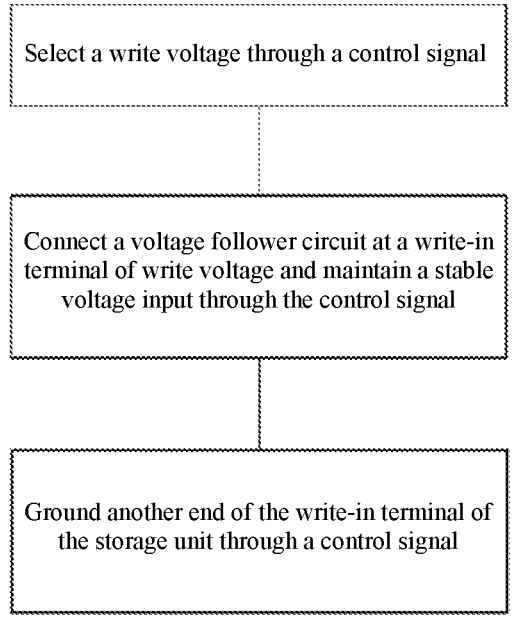
FIG. 6 is a flow diagram of a write method of a high-speed read-write circuit realized according to the present invention and specific to a memristor storage unit.

Based on the foregoing read-write circuit of a memristor, the present invention further provides a read-write method of a memristor, comprising the following steps:

As shown by a flow diagram of a write method of a read-write circuit of a memristor storage unit in FIG. 6, the write method comprises the following main steps:

selecting a write voltage through a first control signal;

connecting a write voltage circuit through a second control signal and maintaining a stable voltage input of a voltage follower circuit to a write-in terminal; and further, for a bipolar memristor, grounding another end of the write-in terminal of the storage unit through a third control signal, thereby realizing connection of a write voltage circuit on a corresponding electrode of the memristor storage unit because the write circuit is integrated and simplified.

To be specific: selecting a first polar write voltage through a first voltage selector 31 and gating a feedback terminal of a first amplifier 211 through a control terminal of a third voltage selector 213 to form a circuit, applying a forward voltage to the storage unit, and meanwhile gating a ground input terminal of a fourth voltage selector 223 through the fourth voltage selector 223 to form a first pole write circuit (form write or erase operation);

Similarly, selecting a second polar write voltage through a second voltage selector 32 and gating a feedback terminal of a second amplifier 221 through a control terminal of a fourth voltage selector 223, applying a reverse voltage to the storage unit, and meanwhile gating a ground input terminal of a third voltage selector 213 through the third voltage selector 213 to form a second pole write circuit (form write or erase operation).

Figure 7:
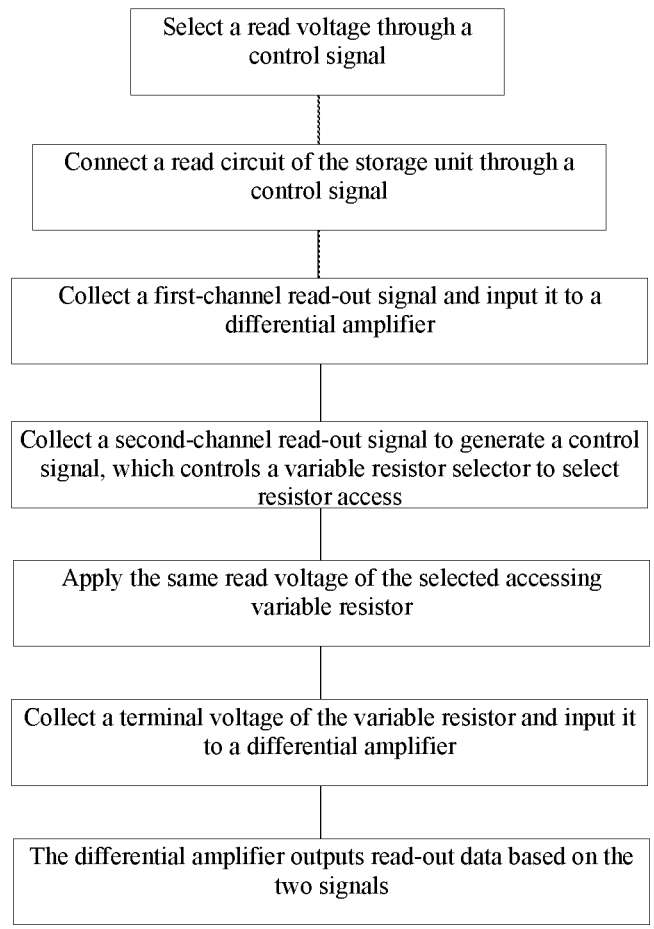
FIG. 7 is a flow diagram of an embodiment of a read method of a high-speed read-write circuit realized according to the present invention and specific to a memristor storage unit.

As shown by an implementation manner of a read-write method of a read-write circuit of a memristor storage unit in FIG. 7, the read method of a memristor realized according to the present invention includes the following main steps:

selecting a read voltage through a first control signal;

connecting a read circuit of a storage unit through a second control signal;

collecting a first-channel read-out signal and inputting it to a differential amplifier;

collecting a second-channel read-out signal to generate a control signal, which selects an appropriate reference resistor to access a reference signal circuit to generate a first-channel reference voltage signal; and outputting read-out data from the differential amplifier according to the first-channel read-out signal and the first-channel reference voltage signal.

Still further, a reference circuit is formed through applying a read voltage by a voltage follower circuit to the side of a variable resistor.

To be specific, for the operation of the foregoing read method: applying a read voltage to a storage unit; and reading a voltage signal at the upper end of a first voltage follower circuit 21 and inputting the voltage signal to one terminal of a sensitive differential amplifier 47;

generating a control signal of a variable resistor selector 45, selecting a resistance value for the variable resistor, applying the same read voltage on the variable resistor, collecting a read-out voltage signal and inputting the voltage signal to another terminal of the sensitive differential amplifier 47 (the output of the sensitive differential amplifier 47 is read-out data).

Figure 8:
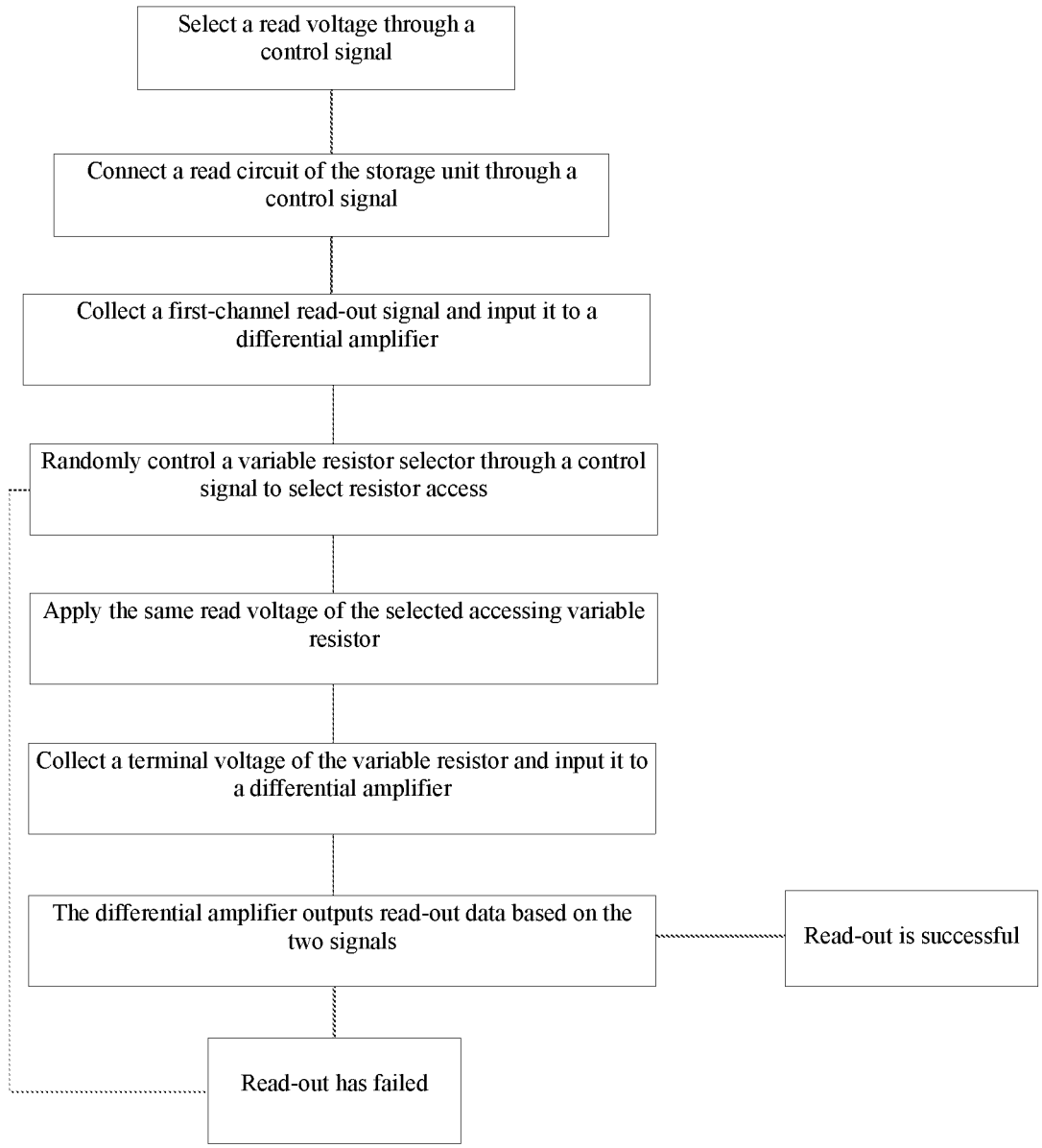
FIG. 8 is a flow diagram of an alternative embodiment of a read method of a high-speed read-write circuit realized according to the present invention and specific to a memristor storage unit.

As shown by an alternative implementation manner of a read method of a read-write circuit of a memristor storage unit in FIG. 8, a voltage signal at the upper end of the first voltage follower circuit 21 can be collected according to the control signal of the variable resistor selector 45 realized by the present invention, and a control signal is formed through a current feedback module 42 to select a variable resistor. Alternatively, a random resistor selection control signal can be directly formed by an external control terminal of the variable resistor selector 45. If reading out fails, other resistance values will be selected in turn until reading out is successful, or otherwise it will be considered that the corresponding storage unit has failed.

As introduced in the foregoing read-out circuit, an implementation manner of the current feedback module 42 is comparators, which collect actual read-out signals of the storage unit and compare the signals with reference signals, thereby generating selection signals of variable resistors. This approach can consider the resistance difference of memristor units to realize smooth read-out and avoid read-out failure caused by resistance difference.

Figure 5:
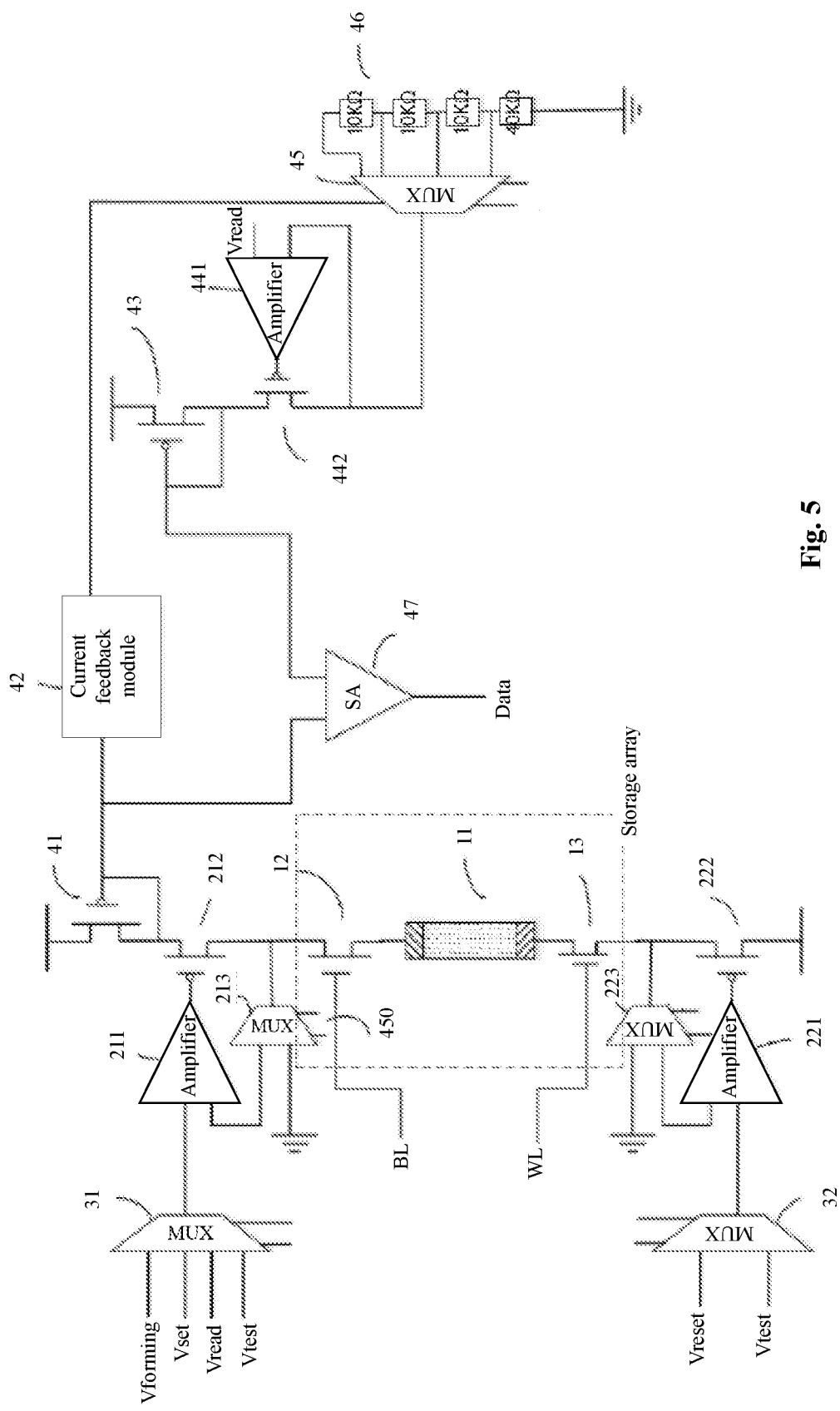
FIG. 5 is a schematic view of a specific circuit structure of an implementation manner of a high-speed read-write circuit realized according to the present invention and specific to a memristor storage unit.

FIG. 5 is a schematic view of a specific circuit structure of an implementation manner of a high-speed read-write circuit realized according to the present invention and specific to a memristor storage unit, where the dashed box represents an N×M storage array. Below the implementation manners of four operations, Forming, Set, Reset and Read will be used to describe the specific implementation process of the foregoing read-write circuit and read-write method. The memristor read-write circuit realized according to an implementation manner of the present invention can achieve fast and stable writing and reading that considers resistance difference, wherein:

Forming operation: A process of setting storage unit initialization at 1 after the storage chip leaves the factory;

Set operation: A process of applying a forward voltage to the storage unit and setting the memristor in a low resistance state;

Reset operation: A process of applying a reverse voltage to the storage unit and setting the memristor in a high resistance state;

Read operation: A process of applying a small voltage in the forward direction and reading the resistance state of the memristor.

In an implementation manner of the present invention, in order to describe the working principle of the foregoing read-write circuit, the working process of the foregoing high-speed read-write circuit is as follows:

(1) Process of Forming operation: Forming is to initialize the selected memristor unit to a low resistance state by applying a certain forward voltage (here, Vforming is used to express a forward voltage) to a memristor storage unit selected through a control signal.

A first voltage selector 31 is a forward voltage 1-of-4 selector, selects a Vforming voltage and inputs it to a first amplifier 211. A third voltage selector 213 is a forward voltage 1-of-2 selector and selects access of an output terminal. Now, through a first feedback tube 212, which is a PMOS tube, a feedback circuit will be formed to stabilize an output terminal of the forward voltage 1-of-2 selector at a Vforming voltage, Meanwhile, a fourth voltage selector 223 is a reverse voltage 1-of-2 selector and will select connection of a ground terminal. A stable follower voltage Vforming will be applied to the upper part (the drain electrode of a bit line selection transistor 12) of the entire storage array module, while the lower part (the source electrode of a word line selection transistor 13) of the array will be grounded. Now, through the bit line transistor switching signal 121 and the word line transistor switching signal 131, a corresponding storage unit will be selected from the N×M array and a forward voltage Vforming will be applied to the upper end of the storage unit to realize the Forming operation.

(2) Process of Set operation: A first voltage selector 31 (forward voltage 1-of-4 selector) selects a Vset voltage and takes a voltage following action through a first feedback tube 212 (PMOS feedback tube). A stable follower voltage Vset will be applied to the upper part (the drain electrode of a bit line selection transistor 12) of the entire storage array module, while the lower part (the source electrode of a word line selection transistor 13) of the array will be grounded. Then the bit line transistor switching signal 121 and the word line transistor switching signal 131 select a storage unit and apply a Vset voltage to the upper end of the storage unit to realize the Set operation.

(3) Process of Reset operation: Reset is to apply a certain reverse voltage (here it is expressed with Vreset) to the selected memristor unit and set the selected memristor unit in a high resistance state.

Firstly, a second voltage selector 32 (reverse voltage 1-of-2 selector) selects a Vreset voltage and inputs the Vreset voltage to a second amplifier 221, and a fourth voltage selector 223 (reverse voltage 1-of-2 selector) selects access of an output terminal.

Now, through a second feedback tube 222 (PMOS feedback tube), a feedback circuit will be formed to stabilize an output terminal of a fourth voltage selector 223 (reverse voltage 1-of-2 selector) at a Vreset voltage and meanwhile control a forward voltage 1-of-2 selector 213 to select connection of a ground terminal.

A stable follower voltage Vreset will be applied to the lower part (the source electrode of a word line selection transistor 13) of the dashed box (entire storage array module), while the upper part (the drain electrode of a bit line selection transistor 12) of the array will be grounded. Now, through the bit line transistor switching signal 121 and the word line transistor switching signal 131, a storage unit will be selected from the N×M array and a reverse voltage Vreset will be applied to the upper end of the storage unit to realize the Reset operation.

(4) Process of Read operation: A first voltage selector 31 (forward voltage 1-of-4 selector) selects a Vread voltage, and a third voltage selector 213 and a first amplifier 211 apply the Vread voltage to the upper end of a storage array. A fourth voltage selector 223 (reverse voltage 1-of-2 selector) will ground the lower end of the storage array. Then through a bit line transistor switching signal 121 and a word line transistor switching signal 131, a Vread voltage is applied to the reselected storage unit. Now a read current is generated on the entire branch;

A first current-voltage conversion circuit (a diode is connected to a PMOS tube 212 for converting current into voltage) will generate a voltage at one end of a sensitive amplifier 47. Meanwhile through a current feedback circuit 42, this voltage will generate a control signal, which acts upon a variable resistor selector 45. An external selector control signal and a control signal generated by the current feedback circuit 42 act upon the variable resistor selector 45 at the same time to select a corresponding reference resistor.

A third amplifier 441 and a third feedback tube 442 apply a Vread voltage to the reference resistor. Then the branch current of the reference resistor is converted into voltage through a second current-voltage conversion circuit 43 and the voltage is applied to another end of the sensitive amplifier 47. Through differential amplification of the sensitive amplifier 47, voltage comparison is conducted to obtain stored data.

In conclusion, in the read-write method of a memristor realized according to the present invention, with the increase of operation times, the resistance value of the memristor in a low resistance state and the resistance value of the memristor in a high resistance state both will drift (including random fluctuations). Selection of reference resistors will change, too. Through the selection method of variable reference resistors, according to signals of the current feedback module 42 (the feedback module can comprise a plurality of comparators), an optimum reference resistor is selected; or after write-in and read-out failure, an external control signal selects a reference resistor and a read operation is implemented again. If read-out has failed, the next reference resistor will be selected until all reference resistors have been selected and read-out has failed. In this case, failure of the storage unit is determined and a spare storage unit can be enabled.

The read-write circuit and the read-write method realized according to the present invention integrate a read circuit and a write circuit and not only simplify the circuits but also achieve fast and stable provision of voltages through a voltage follower circuit of an amplifier after a selector selects a voltage.

It is worth noting that the foregoing embodiments are enumerated specific implementation manners. In other embodiments of the present invention, a read circuit module of the present invention can be combined with other write circuit modules, or a write circuit module of the present invention can be combined with other read circuit modules. Particularly, the read-write circuit of the present invention is also applicable to memory read and write of a multi-value memristor.

Some circuits in this implementation manner delimit feedback tubes as PMOS, but it is not a strict delimitation. Different MOS tubes are selected according to the connection modes of the circuits. The modes can be changed and selected according to the circuit connection setting of the grid electrode, source electrode and drain electrode.

Further, the current feedback circuit generating control signals in the present invention mainly realizes actual read-out signals, which perform logical selection with reference signals, plural or singular, to select resistance values of variable resistors. The circuit realization forms include analog and digital design methods.

With regard to a selector circuit through which a variable resistor selects an access circuit, in the design of this technical solution, different drift conditions are compared when resistance drift is possible, to select an appropriate resistance value and a read-out reference resistance value. In an implementation manner, a selector is used to select a corresponding resistance access circuit. Alternatively, a reference resistor can be selected through the design method of analog circuit according to the value of read-out voltage. For those skilled in the art, the foregoing circuit design modifications in analog and digital design methods all can achieve the purpose of controlling variable resistors.

For different storage units, the setting of high resistance and low resistance corresponds to forward voltage and reverse voltage applied in various operations such as writing, erasing and reading, and the setting of the corresponding read-write circuit. Symmetric circuit structure forms can be set based on the properties of the material of the storage unit, that is to say, the memristor involved in the foregoing embodiment is a bipolar memristor, but if a unipolar memristor is used, or the setting of other materials results in change in the voltage setting of the read-write terminal, the modules of the read-write circuit and read-write method involved in the present invention can be realized through simple modification. In other words, the present invention also applies to unipolar memristors. Meanwhile, the read-write circuit is also applicable to binary and multi-value storage units and can be adjusted accordingly.

The read-write circuit realized according to the present invention needs a controller to generate various control signals and realize selection and read-write control of a storage unit array. The foregoing control signals need overall control from a memristor chip. Further, the circuit structures of the selector and comparators listed in this embodiment can be obtained in the prior art, too, so the specific structure forms will not be detailed here.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. A memristor read-write circuit, wherein the read-write circuit comprises a voltage follower circuit arranged for a read-write circuit voltage applied to a memristor storage unit, and the voltage follower circuit is connected to a selective voltage according to a control signal, or to a break-over voltage corresponding to the selective voltage and forming a read-write operating circuit with the memristor storage unit to achieve a switching effect on the read-write circuit.

2. The memristor read-write circuit according to claim 1, wherein the voltage follower circuit comprises a voltage selector, an input terminal of the voltage selector accesses a break-over voltage of the operating circuit, another input terminal of the voltage selector is connected to an amplifier, another input terminal of the amplifier accesses the selective voltage, an output terminal of the amplifier is connected to a feedback tube and the voltage selector also accesses the feedback tube to form a voltage follower circuit.

3. The memristor read-write circuit according to claim 1, wherein the read-write circuit is applied between a bipolar memristor and a first voltage selector electrically connected to a pole of the memristor storage unit, and between the bipolar memristor and a second voltage selector electrically connected to the other pole of the memristor storage unit; the foregoing two electrical connections or one of the electrical connections is provided with the voltage follower circuit; and the first voltage selector and the second voltage selector are used to select the selective voltage, which is input to the voltage follower circuit.

4. The memristor read-write circuit according to claim 1, wherein the read circuit comprises a differential amplifier, which outputs read-out data and a first branch of the differential amplifier is from a read-out signal of the memristor storage unit; and the read circuit further comprises a variable resistor selector, which selects a corresponding reference resistor according to the control signal to access a reference voltage circuit to form a second branch read-out signal input to the differential amplifier.

5. The memristor read-write circuit according to claim 4, wherein the reference read voltage circuit comprises a third voltage follower circuit, the third voltage follower circuit comprises a third amplifier and a third feedback tube, an input terminal of the third amplifier accesses an output of the variable resistor selector and meanwhile forms a voltage follower circuit with the third feedback tube and the third amplifier, and another input terminal of the third amplifier is connected to a read voltage signal.

6. A write method of the memristor read-write circuit in claim 1, wherein the foregoing method comprises the following steps:
determining the selective voltage as a write voltage through a first control signal; and;
connecting a write voltage circuit through a second control signal and maintaining a stable voltage input of a voltage follower circuit at a write-in terminal.

7. A read method of the memristor read-write circuit in claim 1, wherein the foregoing method comprises the following steps:
determining the selective voltage as a read voltage through a first control signal; and;
connecting a read voltage circuit through a second control signal, maintaining a stable voltage input of a voltage follower circuit at a read-in terminal and reading a signal.

8. The read method of the memristor read-write circuit according to claim 7, wherein the read method further comprises the following steps:
collecting a first-channel read-out signal of the memristor storage unit and inputting it to a differential amplifier;
generating a fourth control signal to control the variable selective resistor to access a reference read voltage circuit;
inputting a read-out voltage of the reference read voltage circuit as a first-channel reference signal into the differential amplifier; and
outputting read-out data by the differential amplifier according to the first-channel read-out signal and the first-channel reference signal.

9. The read method according to claim 8, wherein the fourth control signal is a control signal generated from comparison between the first-channel read-out signal and the reference signal, or a control signal selector randomly selects and accesses a variable resistor and is adjusted after a read-out failure, to select other resistors to continue the read operation until read-out is completed and if a preset number of read-out failures is reached, failure of the current memristor storage unit will be determined.

10. The write method according to claim 6, wherein the second control signal connects a write voltage circuit through the following steps:
controlling the voltage follower circuit at a first terminal of the memristor storage unit to connect a selective voltage; and controlling the voltage follower circuit at a second terminal of the memristor storage unit to connect a break-over voltage corresponding to the selective voltage and forming an operating circuit with the memristor storage unit.

* * * * *